United States Patent [19]

Miller

[11] Patent Number: 5,365,176
[45] Date of Patent: Nov. 15, 1994

[54] WIRING HARNESS SECURITY INSPECTION DEVICE

[76] Inventor: Doyle E. Miller, 16630 C.R. 10, P.O. Box 1474, Bristol, Ind. 46507

[21] Appl. No.: 206
[22] Filed: Jan. 4, 1993
[51] Int. Cl.$^5$ .................... G01R 31/00; H01R 13/44
[52] U.S. Cl. .................................... 324/539; 439/131
[58] Field of Search ............... 439/131, 353, 354; 324/539, 538, 503

[56] References Cited

U.S. PATENT DOCUMENTS

| | | | |
|---|---|---|---|
| 3,974,446 | 8/1976 | Schustzer, Jr. | 324/539 |
| 4,670,707 | 6/1987 | Allard | 324/539 |
| 4,716,474 | 12/1987 | Kiuchi | 439/131 |
| 4,763,226 | 8/1988 | Pelletier | 439/131 |
| 4,859,953 | 8/1989 | Young et al. | 324/539 |

FOREIGN PATENT DOCUMENTS

| | | | |
|---|---|---|---|
| 0396513 | 11/1990 | European Pat. Off. | 439/354 |
| 2643513 | 8/1990 | France | 439/354 |
| 0018277 | 1/1988 | Japan | 324/539 |

Primary Examiner—Maura K. Regan
Attorney, Agent, or Firm—John J. Gaydos

[57] ABSTRACT

A wiring harness security inspection device having a cradle pivotally supported on a base is provided with a front socket for receiving a wiring harness connector and a rear socket for connecting the device to an electrical testing machine. After the connector is inserted into the front socket of the cradle, rotation of the cradle interlocks the connector to the base. The wiring harness cannot be used by an operator in production and installed and interconnected into an electrical circuit until the wiring harness is electrically tested and, when the harness passes inspection, a solenoid mounted in the base releases a latch permitting removal of the device from the connector thereby permitting use and installation of the wiring harness by the operator into the circuit.

6 Claims, 1 Drawing Sheet

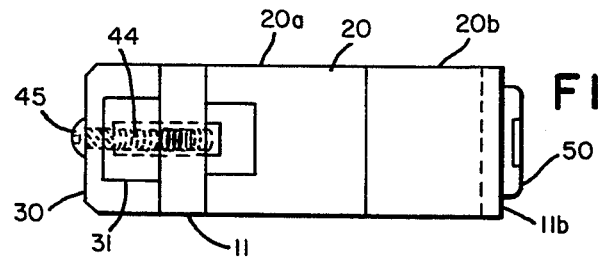
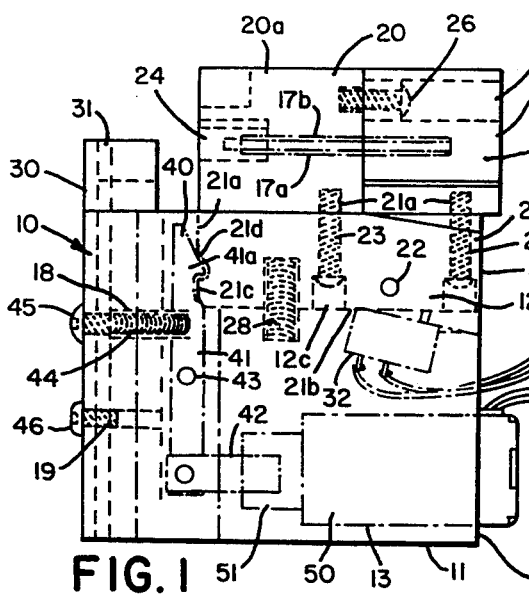
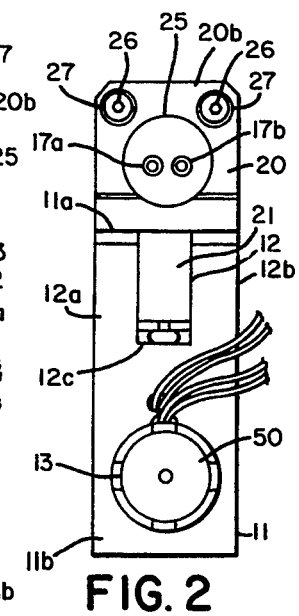
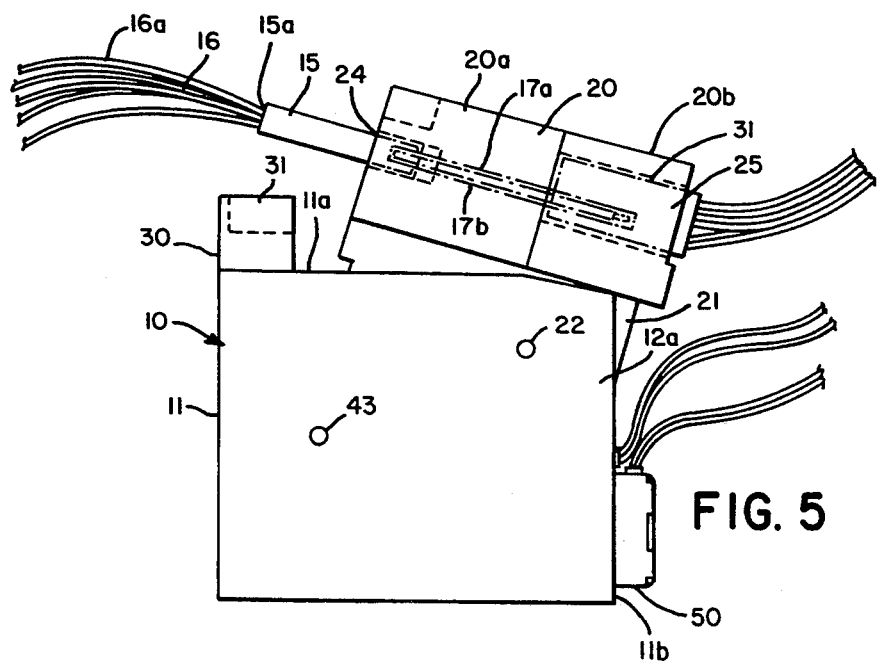

1

WIRING HARNESS SECURITY INSPECTION DEVICE

BACKGROUND OF THE INVENTION

The present invention relates generally to a security inspection device and, more particularly, to a security inspection device attachable to an electrical wiring harness for preventing a person from installing and connecting the wiring harness onto a frame, e.g., of a motor vehicle, before the harness passes electrical inspection.

Generally, a wiring harness is made from a plurality of different length wires, preferably copper, of the same or different gauge, tied or strapped together, each wire being covered with color coded insulation. Early prior art wiring harnesses were made on location by a person first cutting, then stripping the insulation from each of the end portions of the wires, and then connecting the end portions of the wires having various color coded insulation to designated terminals of electrical devices and to terminals connected to a source of electrical energy. For example, wires in a harness are connected from a light bulb or a motor to an electrical storage battery, and a switch is interconnected therebetween for controlling the electrical current from the battery to the electrical device. The wiring connections generally were then further secured by welding, soldering or clamping of the wire ends to the terminals. As the state of the wiring harness art progressed, wires for a harness were first assembled on a harness forming board and the harness was then installed onto a motor vehicle frame. As advances were made in the art, many of the stripped wire ends were secured to solderless wire wrap terminals or welded to tabs insertable into mating connectors. For many years a wiring harness, for example, for a vehicle, contained wires interconnecting a battery to an ignition system and to several electrical devises such as a plurality of motors, light bulbs and a radio. As additional electrical devices were secured to the vehicle frame, the wiring harness connecting the devices to a battery also became more complex. Currently, a vehicle wiring harness for a motor vehicle interconnects a battery and a large variety of electrical devices to a computer. Occasionally a wiring harness is defectively made on a harness forming board or damaged prior to installation onto a vehicle frame. It would, therefore, be desirable to detect a defective wiring harness and prevent a person from securing and connecting the harness to electrical devices of a motor vehicle.

Prior art devices and procedures for avoiding installation of a defective wiring harness onto a vehicle frame have not been entirely effective because a person not knowing that the harness has an internal defect could still install and connect the harness onto a vehicle frame. As readily known to those skilled in the art, the cost of replacing a defective harness installed in a vehicle frame is substantial. A solution to the problem is to require a person to inspect and electrically test the wiring harness immediately prior to installation of the harness onto the frame. However, to conduct an electrical test of the harness immediately prior to installation of the harness onto a frame requires complicated and expensive electrical testing equipment at each assembly location. Further experience has proven that in a motor vehicle assembly plant, the inspection department should be separate and independent from the production department. Another approach is to identify a harness with an inspection tag attachable to the wiring harness for designating a defective or approved harness, such tags being readily available on the market. But such tags have not been entirely effective because the tags could readily be removed from a defective wiring harness before installation of the harness onto a frame especially when approved harnesses are not available and motor vehicle frames are moving on a production line requiring a wiring harness. It would, therefore, be desirable to provide a security inspection device that can be removed from an electrical wiring harness only after the harness passes electrical inspection.

Accordingly, it is an object of the present invention to provide a new and improved electrical wiring harness security inspection device of the character described above.

Another object of the present invention is to provide a new and improved electrical wiring harness security inspection device which obviates the above-described disadvantages of the prior art devices.

A further object of the present invention is to provide a new and improved electrical wiring harness security inspection device embodying a novel structural assembly of a base, a cradle for receiving a connector of a wiring harness, and retaining means for maintaining the cradle attached to the connector of the wiring harness until the wiring harness passes inspection.

Still another object of the present invention is to provide an electrical wiring harness security inspection device with an electrical latching mechanism permitting removal of a connector of a wiring harness from a cradle only after the electrical wiring harness has passed electrical inspection.

Further objects and advantages of the present invention will become apparent as the following description proceeds, and the features of novelty characterizing the invention will be pointed out with particularity in the claims annexed to and forming a part of this specification.

SUMMARY OF THE INVENTION

In summary, to accomplish the foregoing and other objects of the present invention, there is provided a wiring harness security inspection device comprising a base generally rectangular in shape having a cradle supported on the base for pivotal movement from an unlocked to a locked position, retaining means cooperating with the cradle for securing a connector of a wiring harness to the cradle, latching means engageable with the cradle for maintaining the cradle in the locked position, and actuating means moving the latching means into and out of engagement with the cradle. When the cradle is in the unlocked position, a connector of a wiring harness can be inserted into a socket provided in the cradle. The cradle is then moved into cooperation with the retaining means to prevent the connector of the wiring harness from being removed from the cradle until the wiring harness passes electrical inspection at which time the actuating means releases the latching means and permits removal of the connector of the wiring harness from the cradle.

DESCRIPTION OF THE DRAWINGS

For a better understanding of the present invention, reference may be had to the accompanying drawings in which all of the parts are numbered, the same numbers being used to refer to corresponding parts throughout, and wherein:

FIG. 1 is a side view of the wiring harness security inspection device embodying the features of the present invention and having certain elements shown in phantom;

FIG. 2 is a rear view of the wiring harness security inspection device shown in FIG. 1;

FIG. 3 is a front view of the wiring harness security inspection device shown in FIG. 1;

FIG. 4 is a top view of the wiring harness security inspection device shown in FIG. 1; and FIG. 5 is a side view of the wiring harness security inspection device, similar to FIG. 1, but secured to a wiring harness.

DETAILED DESCRIPTION OF THE INVENTION

Referring now to the drawings, there is shown an embodiment of the present invention in the form of a wiring harness security inspection device 10 comprising a base 11, a cradle 20 supported on the base 11, retaining means 30 cooperating with the cradle for securing a connector 15 of a wiring harness 16 to the cradle, latching means 40 engageable with the cradle for maintaining the cradle in a locked position, and actuating means 50 for moving the latching means 40 from an unlocked (FIG. 1) to a locked (FIG. 2) position.

The base 11 is machined or molded from a suitable electrically insulating plastic such as Nylon material and, formed into a rectangular block. As best shown in FIGS. 1 and 2 of the drawings, the top portion 11a of the base 11 is provided with an elongated slot 12 and a rocker 21 of Nylon material supporting the cradle 20 is received in the slot 12. The side walls 12a and 12b of the slot 12 guide movement of the rocker 21. The base 11 is also provided with an elongated cylindrical cavity 13 communicating with the rear side 11b of the base and the actuating means 50, e.g., an electrical solenoid, is secured in the cavity.

Preferably and in accord with the present invention, the cradle 20 and the rocker 21 are pivotally supported in the base with a pin 22 secured in suitable holes provided in the sidewalls 12a,12b of the base 11 defining the elongated slot 12 and are pivotably movable from the locked to the unlocked position. The cradle 20 generally in the form of an elongated rectangular block also of a Nylon material is secured to the rocker 21 with a pair of screws 23. The screws 23 are inserted into vertical holes 21a communicating with the bottom surface 21b of the rocker 21 and, as best shown in FIG. 1 of the drawings, the heads of the screws are recessed in the rocker 21. By detachably securing the rocker 21 to the cradle 20 with a pair of screws 23, the cradle 20 of different configurations can be secured to the rocker 21, the specific design of the cradle being determined by the type of connector 15 secured to the end of the wiring harness 16.

As best shown in FIGS. 1 and 5 of the drawings, the cradle 20 is provided with a front socket 24 and a rear socket 25 and a plurality of electrical receptacles 17a,17b are secured in the center portion of the cradle. One end of each of the receptacles 17a,17b is disposed in the front socket 24 of the cradle for receiving the connector 15 of the wiring harness 16 and the other end of each of the receptacles is disposed in the rear socket 25 of the cradle 20 for connecting the wiring harness 16 to a not shown electrical testing machine with an electrical connector 31 insertable into the rear socket 25 of the cradle 20. Although only two receptacles are shown in the drawings, it is to be understood that one receptacle is generally required for connecting each of the wires of the wiring harness 16 to the not shown testing machine. To facilitate installation and assembly of the receptacles 17a,17b into the center portion of the cradle 20, the cradle is made in two sections 20a and 20b and the sections are secured together with a pair of screws 26 received in a pair of cylindrical holes 27 extending inwardly from the rear surface of the section 20b of the cradle 20.

The connector 15 can be inserted or removed from the front socket 24 of the cradle 20, as best shown in FIGS. 4 and 5 of the drawings, only when the cradle is in the unlocked position. Biasing means such as a spring 28, interposed between the bottom portion 21b of the rocker and the bottom surface 12c of the slot 12, biases the cradle 20 in the unlocked position and at a slight angle to the top surface of the base 11. After the connector 15 is inserted in the socket 24, the cradle 20 can be manually rotated to the locked position. The retaining means 30 comprises an abutment or block secured to the base 11 in a suitable manner and is provided with a cavity 31 for receiving the rear portion 15a of the connector 15 to prevent removal of the connector 15 from the cradle 20 of the security inspection device 10 when the cradle is in the locked position. For the purpose of sensing the position of the cradle 20 with respect to the base 11, a microswitch 32 is fixedly secured in the base below the slot 12 and, when the cradle 20 is in the locked position, the microswitch preferably is in a closed position. An electrical circuit is controlled by the microswitch and, if the wiring harness passes inspection, a not shown computer sends an electrical signal to the not shown testing machine for energizing the actuating means 50 for unlocking the security inspection device 10 thereby permitting removal of the security inspection device 10 from the wiring harness 16.

In accord with the present invention, the latching means 40 is mounted in the base 11 and maintains the cradle 20 in the locked position as best shown in FIG. 1 of the drawings. The latching means 40 comprises an elongated latching finger 41 having a distal end 41a biased against the front surface 21c of the rocker 21 and receivable in a notch 21d provided in the front surface 21c of rocker 21. The latching finger 41 is connected to a link 42 secured to the actuating means 50. A pin 43 secured in aligned holes provided in the base pivotally supports the latching finger 41 in the base 11 permitting the latching finger 41 to pivot from the engaged or locked to the disengaged or unlocked position. For the purpose of maintaining the latching finger 41 biased against the front surface 21c of the rocker 21, spring means 44, such as a coiled helical spring, is received in a hole 18 provided in the base 11 and a screw 45 threadedly secured in the hole 18 and engaging one end of the spring means 44 controls the biasing force applied by the spring means against the latching finger 41. As is readily apparent, rotation of the screw 45 alters the biasing force of the spring means against the latching finger 41. A screw 46 threadedly secured in and removable from a hole 19 provided in the base 11 provides access to the latching finger 41. With the use of a screwdriver, the cradle 20 can be unlocked by applying a force against the finger 41 in alignment with the hole 19. The actuating means 50, e.g., a solenoid, readily available on the market, comprises an electrical coil and an armature 51 connected to the link 42 of the latching means 40. Energization of the actuating means 50, pivots the latching finger 41 from the locked position to the unlocked position and releases the rocker 21 causing the cradle to rotate clockwise into a unlocked position and enables an operator to remove the connector from the security inspection device.

It will be apparent to one skilled in the art that the present invention may be embodied in other specific forms without departing from the spirit or essential attributes thereof. It is, therefore, desired and intended that the several embodiments herein specifically set forth be considered in all respects as illustrative and not restrictive, reference being made to the appended claims rather than the foregoing description and drawings to indicate the scope of the invention, which is to be understood as limited only by the scope of the appended claims.

The invention claimed is:

1. A wiring harness security inspection device comprising a base, a cradle supported on the base and movable from an unlocked to a locked position, retaining means cooperating with the cradle for securing a connector of a wiring harness to the cradle, latching means engageable with the cradle for maintaining the cradle in the locked position, and actuating means for moving the latching means into and out of engagement with the cradle whereby upon attaching the connector to the cradle and moving the cradle to the locked position to secure the connector to the cradle with the retaining means, the connector cannot be removed from the cradle until the wiring harness passes electrical inspection indicating proper securement of the connection to the wiring harness and the sending of an electrical signal for energizing the actuating means thereby enabling the actuating means to release the latching means and move the cradle to the unlocked position for removal of the connector from the cradle.

2. The wiring harness security inspection device of claim 1, wherein the actuating means comprises a solenoid having an armature engageable with the latching means.

3. The wiring harness security inspection device of claim 2, wherein the latching means comprises an arm pivotally mounted on the base, one end of the arm being connected to the armature and the other end of the arm being biased against the cradle.

4. The wiring harness security inspection device of claim 1, wherein the retaining means comprises a cavity engageable with the connector for retaining the connector in the cradle until the wiring harness passes electrical inspection.

5. The wiring harness security inspection device of claim 1, further comprising biasing means and wherein the cradle is pivotally supported on the base, the biasing means maintains the cradle in the unlocked position for insertion and removal of the connector into and from a socket provided in the cradle.

6. The wiring harness security inspection device of claim 1, further comprising a switch for electrically signaling the position of the cradle on the base.

* * * * *